(12) United States Patent
Adam et al.

(10) Patent No.: US 9,401,373 B2
(45) Date of Patent: Jul. 26, 2016

(54) MULTI-FIN FINFETS WITH MERGED-FIN SOURCE/DRAINS AND REPLACEMENT GATES

(71) Applicant: GLOBALFOUNDRIES INC., Grand Cayman (KY)

(72) Inventors: Thomas N. Adam, Slingerlands, NY (US); Kangguo Cheng, Schenectady, NY (US); Ali Khakifirooz, Los Altos, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/641,462

(22) Filed: Mar. 9, 2015

(65) Prior Publication Data

US 2015/0187815 A1    Jul. 2, 2015

Related U.S. Application Data

(62) Division of application No. 14/032,212, filed on Sep. 20, 2013, now Pat. No. 9,048,262.

(51) Int. Cl.
*H01L 27/12* (2006.01)
*H01L 29/66* (2006.01)
*H01L 29/78* (2006.01)
(Continued)

(52) U.S. Cl.
CPC .... *H01L 27/1211* (2013.01); *H01L 21/823431* (2013.01); *H01L 27/0886* (2013.01); *H01L 29/0847* (2013.01); *H01L 29/161* (2013.01); *H01L 29/167* (2013.01); *H01L 29/6681* (2013.01); *H01L 29/7851* (2013.01)

(58) Field of Classification Search
CPC ............... H01L 21/823431; H01L 21/823821; H01L 21/845; H01L 27/0886; H01L 27/0924; H01L 27/10879; H01L 29/66795
USPC ........... 257/288, 368, 369; 438/151, 197, 199
See application file for complete search history.

(56) References Cited

U.S. PATENT DOCUMENTS 7,893,492 B2    2/2011    Bedell et al.
8,080,838 B2    12/2011    Chang et al.
(Continued)

OTHER PUBLICATIONS

Pending U.S. Appl. No. 14/032,212, entitled: "Multi-fin finFETs With Merged-fin Source/Drains and Replacement Gates", filed Sep. 20, 2013.

*Primary Examiner* — Jarrett Stark
*Assistant Examiner* — Shahed Ahmed
(74) *Attorney, Agent, or Firm* — Scully Scott Murphy and Presser; Frank Digiglio

(57) ABSTRACT

A semiconductor structure including semiconductor fins, a gate over a middle portion of the semiconductor fins, and faceted semiconductor regions outside of the gate separated from gaps may be formed. The semiconductor structure may be formed by forming fins on a semiconductor substrate where each fin has a pair of sidewalls aligned parallel to the length of the fin, growing dummy semiconductor regions on the sidewalls of the fins, forming a sacrificial gate that covers a center portion of the fins and the dummy semiconductor regions, removing portions of the dummy semiconductor regions not covered by the sacrificial gate, and growing faceted semiconductor regions on the sidewalls of the portions of the fins not covered by the sacrificial gate. The faceted semiconductor regions may intersect to form gaps between the faceted semiconductor regions and the gate.

18 Claims, 20 Drawing Sheets

(51) Int. Cl.
*H01L 21/8234* (2006.01)
*H01L 27/088* (2006.01)
*H01L 29/08* (2006.01)
*H01L 29/161* (2006.01)
*H01L 29/167* (2006.01)

(56) References Cited

U.S. PATENT DOCUMENTS

| | | |
|---|---|---|
| 8,367,498 B2 | 2/2013 | Chang et al. |
| 8,652,932 B2 | 2/2014 | Adam et al. |
| 2011/0073952 A1 | 3/2011 | Kwok et al. |
| 2011/0298058 A1* | 12/2011 | Kawasaki ........... H01L 29/7853 257/401 |
| 2011/0316081 A1 | 12/2011 | Chan et al. |
| 2012/0018813 A1 | 1/2012 | Holmes et al. |
| 2012/0068264 A1 | 3/2012 | Cheng et al. |
| 2014/0191315 A1* | 7/2014 | Ito ................... H01L 29/66484 257/336 |
| 2014/0203370 A1* | 7/2014 | Maeda ................ H01L 29/785 257/365 |

* cited by examiner

MULTI-FIN FINFETS WITH MERGED-FIN SOURCE/DRAINS AND REPLACEMENT GATES

BACKGROUND

The present invention relates to semiconductor devices, and particularly to fabricating multi-fin fin field effect transistor (finFET) devices with merged-fin source/drains and replacement gates.

FinFETs are an emerging technology which may provide solutions to field effect transistor (FET) scaling problems at, and below, the 22 nm node. FinFET structures include at least one narrow semiconductor fin gated on at least two sides of each of the at least one semiconductor fin. FinFETs including more than one fin may be referred to as multi-fin finFETs. FinFET structures may be formed on a semiconductor-on-insulator (SOI) substrate, because of the low source/drain diffusion, low substrate capacitance, and ease of electrical isolation by shallow trench isolation structures. FinFETs may be also formed on bulk substrates to reduce wafer cost and/or enable formation of certain devices in the bulk substrate.

Due in part to the relative instability of the gate dielectric layer deposited over the finFET and work function metal layer of the gate, a replacement metal gate, or gate-last, fabrication process may be used to form multi-fin finFETs, where a sacrificial gate is formed over the semiconductor fins prior to forming source/drain regions and depositing the dielectric layer over the finFET. The sacrificial gate is later removed and replaced by a replacement metal gate (RMG) potentially including a gate dielectric layer, a work function metal layer, and a metal electrode. Because the RMG is formed after the other components of the FET, it is not subjected to various potentially damaging processing steps, for example high-temperature anneals.

SUMMARY

The present invention relates to multi-fin semiconductor structures and methods of forming the same. The semiconductor may include semiconductor fins, a gate over a middle portion of the semiconductor fins, and faceted semiconductor regions between the semiconductor fins outside of the gate. Gaps may exist between the faceted semiconductor regions and the gate so that the faceted semiconductor regions do not directly contact the gate.

In another embodiment of the invention, a semiconductor structure may be formed by forming fins on a semiconductor substrate, where each fin has a pair of sidewalls aligned parallel to the length of the fin, growing dummy semiconductor regions on the sidewalls of the fins, forming a sacrificial gate that covers a center portion of the fins and the dummy semiconductor regions, removing portions of the dummy semiconductor regions not covered by the sacrificial gate, and growing faceted semiconductor regions on the sidewalls of the portions of the fins not covered by the sacrificial gate. The faceted semiconductor regions may intersect to form gaps between the faceted semiconductor regions and the gate. After forming the faceted semiconductor regions, a dielectric layer may be deposited over the structure, so that the dielectric layer fills the gaps between the faceted semiconductor regions and the sacrificial gate, and the sacrificial gate and remaining dummy semiconductor regions may be replaced with a replacement metal gate.

In another embodiment of the invention, a finFET device may be formed by forming fins on a semiconductor substrate, where each fin has a pair of sidewalls aligned parallel to the length of the fin, merging the fins by selectively growing dummy semiconductor regions on the sidewalls of the fins, forming a sacrificial gate that covers a center portion of the fins and the dummy semiconductor regions, replacing the portions of the dummy semiconductor regions not covered by the sacrificial gate with faceted semiconductor regions separated from the sacrificial gate by gaps, depositing a dielectric layer that fills the gaps, and replacing the sacrificial gate and remaining dummy semiconductor regions with a replacement metal gate. The top surfaces of the dummy semiconductor regions may be substantially coplanar with the top surfaces of the semiconductor fins.

Figure 1A:
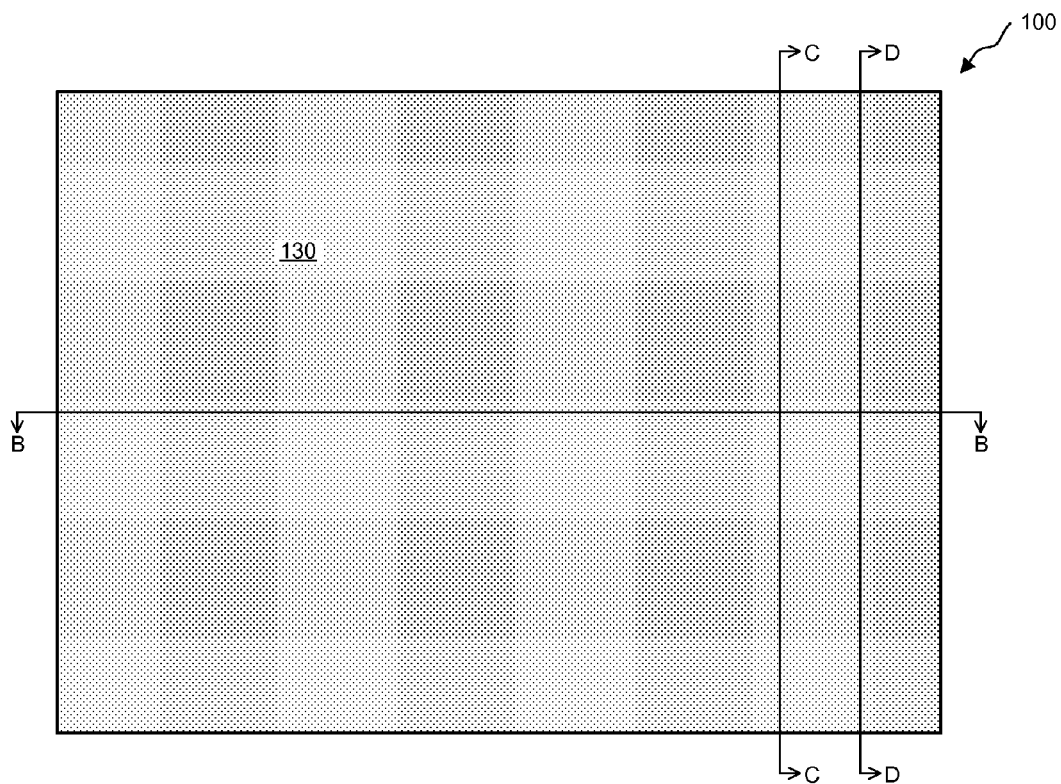
FIG. 1A is a top view of a semiconductor-on-insulator (SOI) substrate, according to an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the invention include methods of forming multi-fin finFET structures having replacement metal gates and faceted source drain regions. Embodiments may include forming fins on a substrate, forming dummy semiconductor regions between the fins, forming a sacrificial gate above the fins and the dummy semiconductor regions, removing the dummy semiconductor regions from between the fins outside of the sacrificial gate, growing faceted source/drain regions on the fins outside of the sacrificial gate, depositing a dielectric layer, and replacing the sacrificial gate and dummy semiconductor regions beneath the sacrificial gate with a replacement metal gate. By forming the dummy semiconductor regions and using faceted source/drain regions, multi-fin finFET structures may be formed while avoiding the difficulties related to the three-dimensional topography of the structure, including complete removal of the sacrificial gate from between the fins and formation of a spacer on the sacrificial gate but not on the fins outside the sacrificial gate.

Figure 1B:
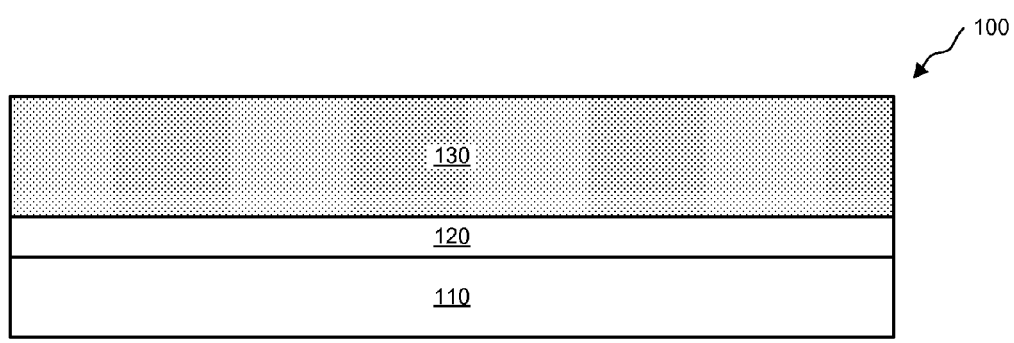
FIGS. 1B-1D are cross sectional views of FIG. 1A, according to embodiments of the present invention.
Figure 1C:
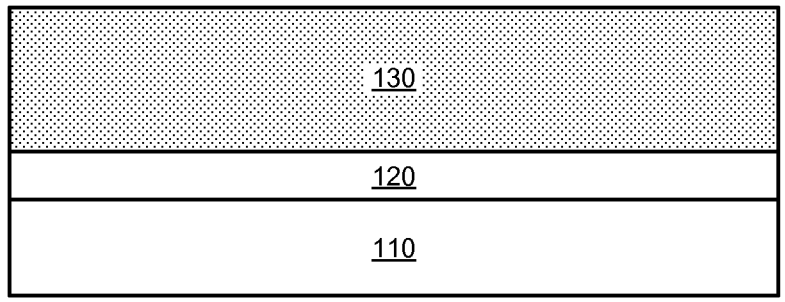
Figure 1D:
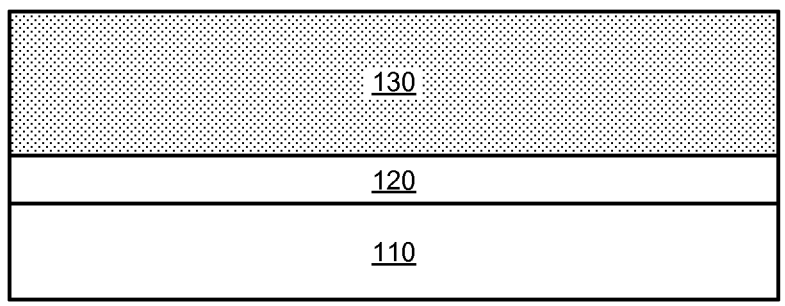

Referring to FIGS. 1A-1D, a semiconductor-on-insulator (SOI) substrate 100 may be provided including a base substrate 110, an insulator layer 120, and an SOI layer 130. It is noted that although FIGS. 1A-1D depict an SOI substrate, other embodiments may utilize a bulk semiconductor substrate. The insulator layer 120 may isolate the SOI layer 130 from the base substrate 110. The base substrate 110 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 110 may be approximately, but is not limited to, several hundred microns thick. For example, the base substrate 110 may have a thickness ranging from approximately 0.5 mm to approximately 1.5 mm.

The buried insulator layer 120 may be formed from any of several dielectric materials. Non-limiting examples include, for example, oxides, nitrides, oxynitrides of silicon, and combinations thereof. Oxides, nitrides and oxynitrides of other elements are also envisioned. In addition, the buried insulator layer 120 may include crystalline or non-crystalline dielectric material. The buried insulator layer 120 may be 100-500 nm thick, preferably about 200 nm.

The SOI layer 130 may be made of any of the several semiconductor materials possible for the base substrate 110. In general, the base substrate 110 and the SOI substrate layer 130 may include either identical or different semiconducting materials with respect to chemical composition, dopant concentration and crystallographic orientation. The SOI layer 130 may be doped with p-type dopants such as boron or doped with n-type dopants such as phosphorus and/or arsenic. The dopant concentration may range from approximately $1\times10^{15}$ cm$^{-3}$ to approximately $1\times10^{19}$ cm$^{-3}$, preferably approximately $1\times10^{15}$ cm$^{-3}$ to approximately $1\times10^{16}$ cm$^{-3}$. In one embodiment, the SOI layer is undoped. The SOI layer 130 may have a thickness ranging from approximately 5 nm to approximately 300 nm, preferably approximately 30 nm.

Figure 2A:
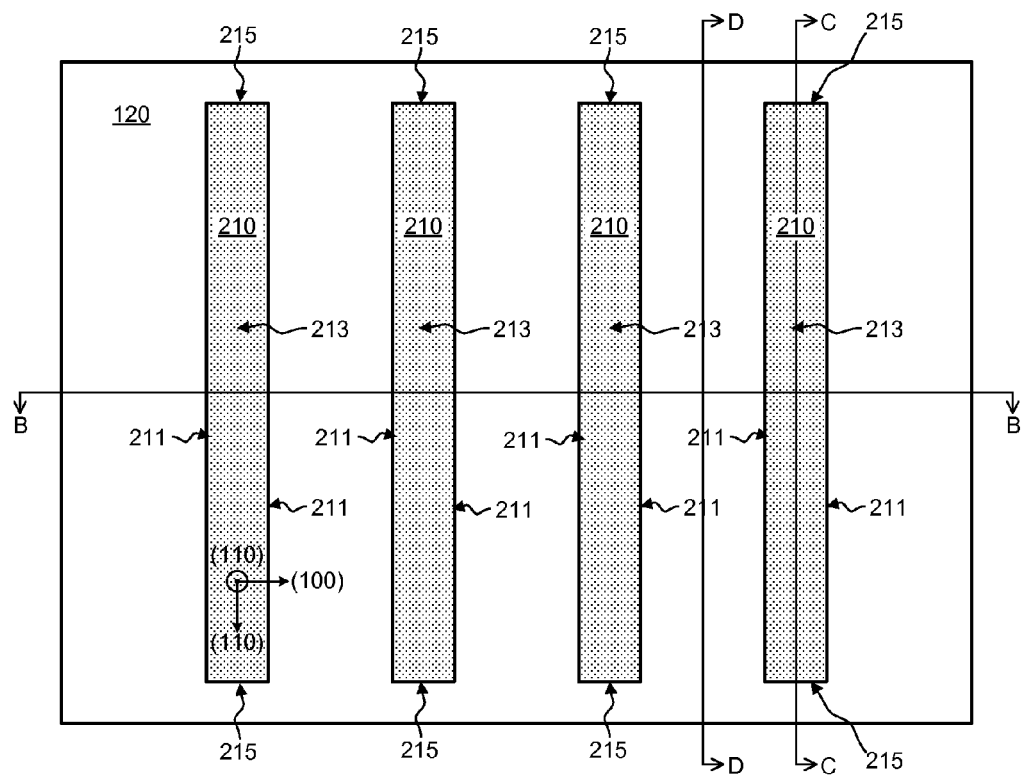
FIG. 2A is a top view depicting forming fins from the top semiconductor layer of the SOI substrate of FIGS. 1A-1D, according to embodiments of the present invention.
Figure 2B:
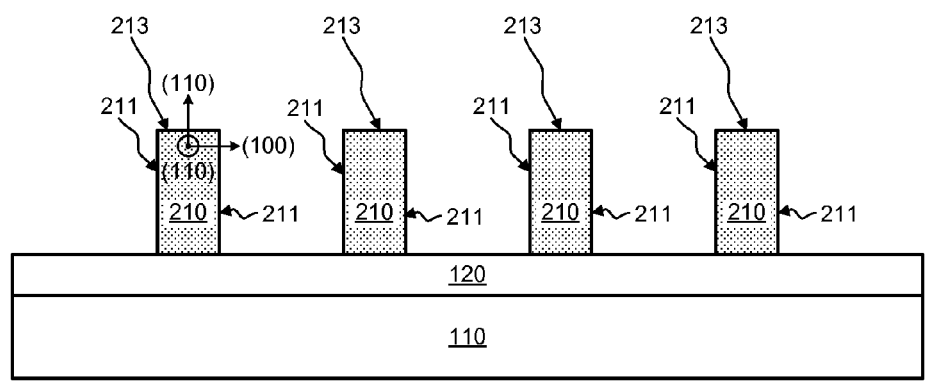
FIGS. 2B-2D are cross-sectional views of FIG. 2A, according to embodiments of the present invention.
Figure 2C:
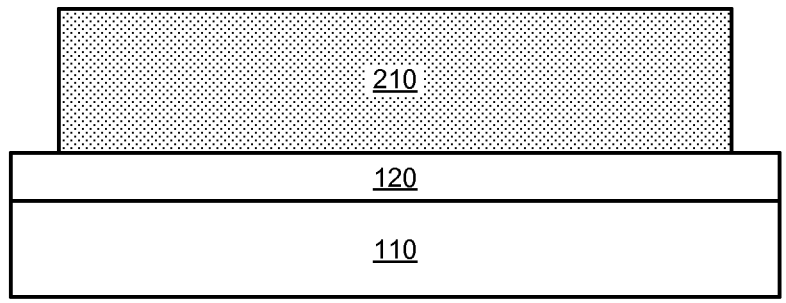
Figure 2D:
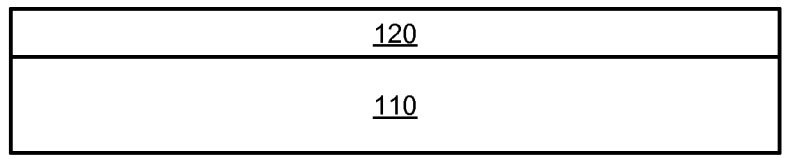

Referring to FIGS. 2A-2D, a plurality of fins 210 may be formed, for example, by removing material from the SOI layer 130 (FIGS. 1A-1D) using a photolithography process followed by an anisotropic etching process such as reactive ion etching (RIE) or plasma etching. In an exemplary embodiment, the fins 210 may have a width of approximately 2 nm to approximately 100 nm, preferably approximately 4 nm to approximately 40 nm. Depending on the thickness of the SOI layer 130, the fins 210 may have a height of approximately 5 nm to approximately 300 nm, preferably approximately 10 nm to approximately 80 nm. The fins 210 may be separated by a distance ranging from approximately 20 nm to approximately 80 nm, preferably approximately 30 nm to approximately 50 nm.

Each of the fins 210 may have a pair of sidewalls 211, oriented parallel to the lengths of the fins 210, a pair of end surfaces 215, oriented perpendicular to the lengths of the fins 210, and a top surface 213. The crystal orientation of the SOI layer 130 may be such that the top surfaces 213 and the end surfaces 215 of the fins 210 have a (110) surface while the sidewalls 211 have a (100) surface.

Figure 3A:
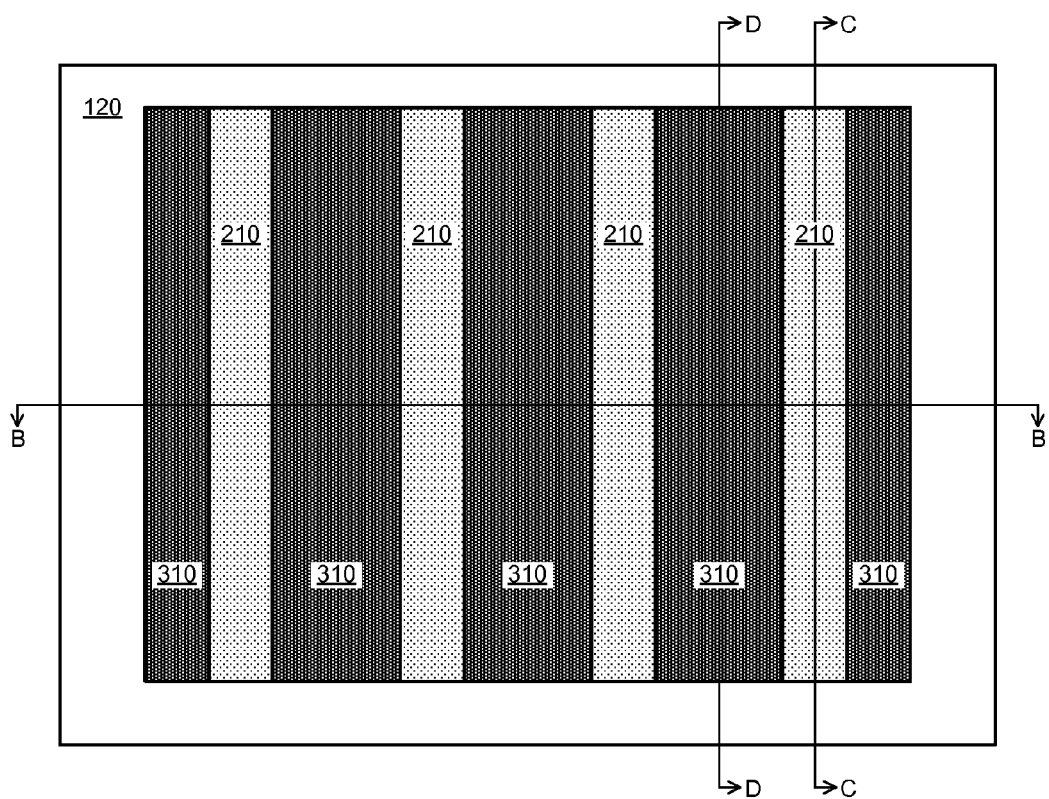
FIG. 3A is a top view depicting forming dummy semiconductor regions between the fins of FIGS. 2A-2D, according to embodiments of the present invention.
Figure 3B:
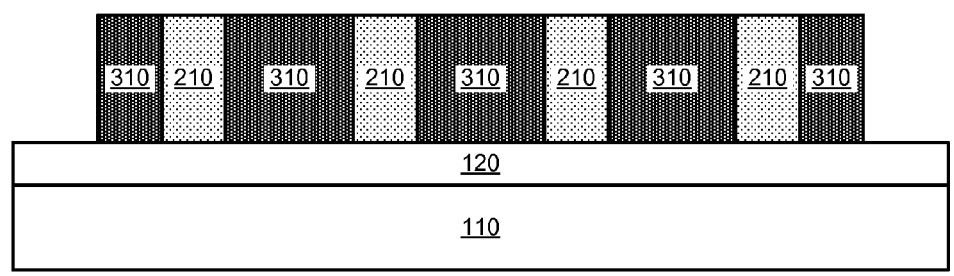
FIGS. 3B-3D are cross-sectional views of FIG. 3A, according to embodiments of the present invention.
Figure 3C:
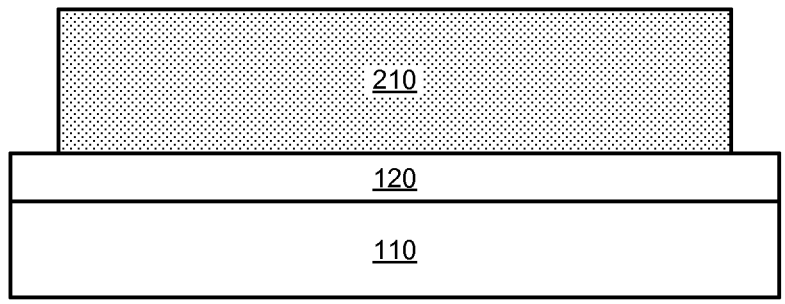
Figure 3D:
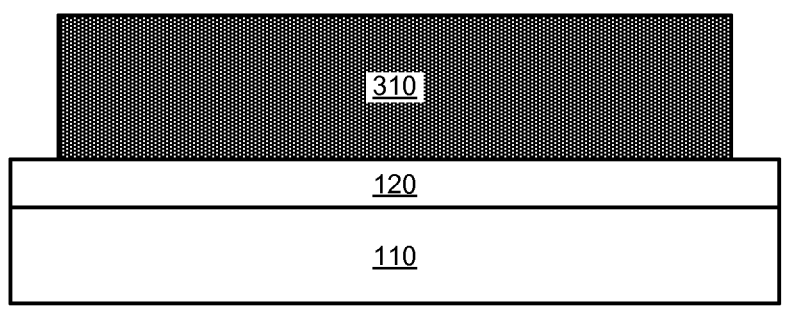

Referring to FIGS. 3A-3D, dummy semiconductor regions 310 may be formed on the sidewalls 211 (FIGS. 2A-2B) of the fins 210. The dummy semiconductor regions 310 may be formed by selectively growing an epitaxial semiconductor material on the sidewalls 211 of the fins 210 but not on the top surfaces 213 (FIGS. 2A-2B) and the end surfaces 215 (FIGS. 2A-2B), so that the top surfaces of the dummy semiconductor regions 310 are substantially coplanar with the top surfaces 213 of the fins 210. The semiconductor material of the dummy semiconductor regions 310 may be selected so that the dummy semiconductor regions 310 may be selectively etched relative to the fins 210. As used herein, the term "selective" in reference to a material removal process denotes that the rate of material removal or growth, as applicable, for a first material is greater than the rate of removal or growth for at least another material of the structure to which the process is being applied. For example, in one embodiment, a selective etch may include an etch chemistry that removes a first material selectively to a second material by a ratio of 10:1 or greater.

In an exemplary embodiment where the fins 210 are made of silicon, the dummy semiconductor regions 310 may be made of, for example, germanium or silicon-germanium alloys. In some embodiments, the silicon-germanium alloys may have a germanium concentration of approximately 5% to approximately 90% by weight, preferably approximately 30% to approximately 60%. In embodiments where the fins 210 are made of silicon-germanium, the dummy semiconductor regions 310 may also be made of silicon-germanium, but with a higher germanium concentration so that the dummy semiconductor regions 310 may still be etched selectively. Epitaxial germanium may be deposited using one or more germanium source gases such as germane, digermane, halogermane, dichlorogermane, trichlorogermane, tetrachlorogermane and combinations thereof. Epitaxial silicon-germanium may be deposited by adding to the germanium source gas a silicon source gas such as silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Figure 4A:
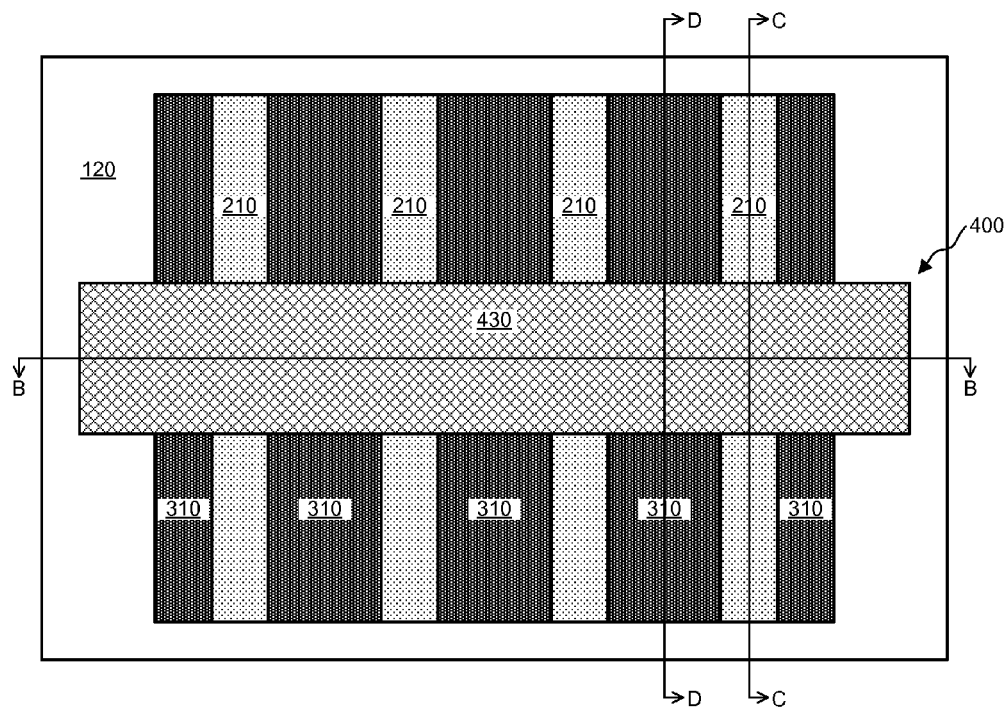
FIG. 4A is a top view depicting forming a sacrificial gate above the fins and dummy semiconductor regions of FIGS. 3A-3D, according to embodiments of the present invention.
Figure 4B:
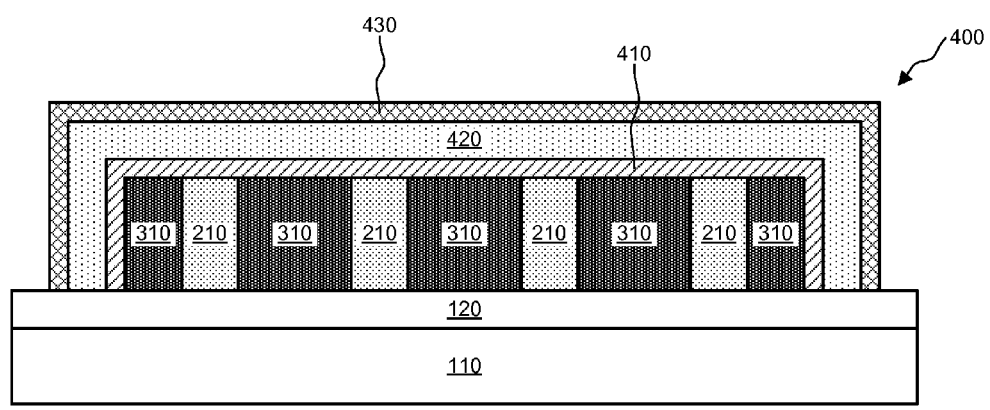
FIGS. 4B-4D are cross-sectional views of FIG. 4A, according to embodiments of the present invention.
Figure 4C:
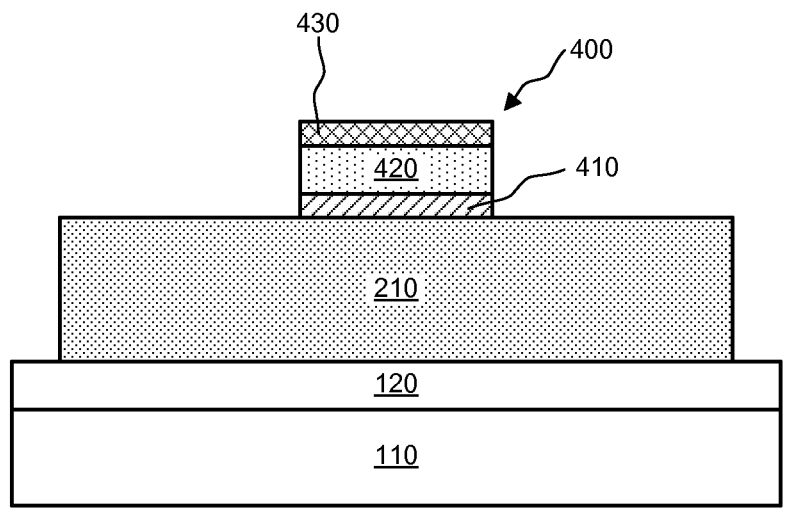
Figure 4D:
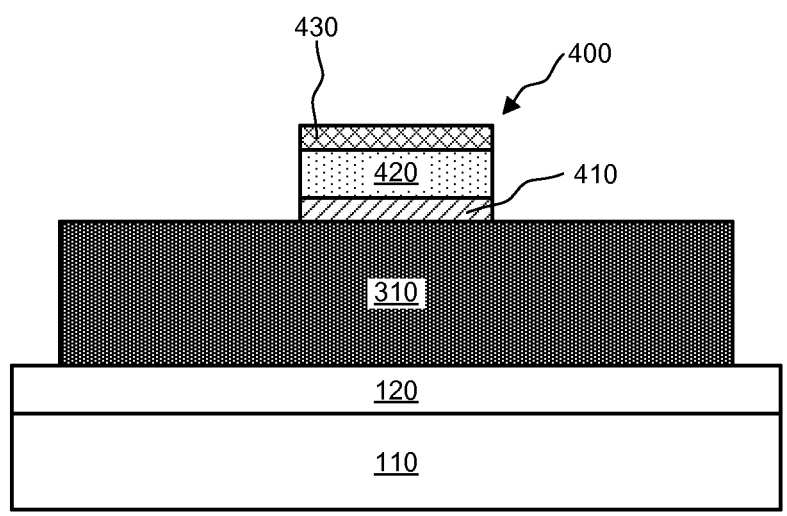

Referring to FIGS. 4A-4D, a sacrificial gate 400 may be formed over a center portion of the fins 210 and the dummy semiconductor regions 310. Because the fins 210 and the dummy semiconductor regions 310 provide a substantially flat surface over which the sacrificial gate 400 may be deposited, the sacrificial gate 400 may be formed without the challenges associated with the complex 3D topography of the fins 210. The sacrificial gate 400 may have a height of approximately 40 nm to approximately 200 nm, preferably approximately 50 nm to approximately 150 nm. The sacrificial gate 400 may include a sacrificial dielectric layer 410 and a sacrificial gate electrode 420. The sacrificial dielectric layer 410 and the sacrificial gate electrode 420 may be formed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD). The sacrificial dielectric layer 410 may be made of any known dielectric materials such as silicon oxide or silicon nitride. The sacrificial gate electrode 420 may be made of, for example, an amorphous or polycrystalline silicon material. Some embodiments may further include a hard cap 430 to protect the sacrificial gate electrode 420. The hard cap 430 may be made of an insulating material, such as, for example, silicon nitride or silicon oxide. In another embodiment, the sacrificial gate 400 may be formed by depositing a sacrificial insulator over a center portion of the fins 210 and the dummy semiconductor regions 310. The sacrificial insulator may be made of typical insulating materials, including for example silicon nitride.

Figure 5A:
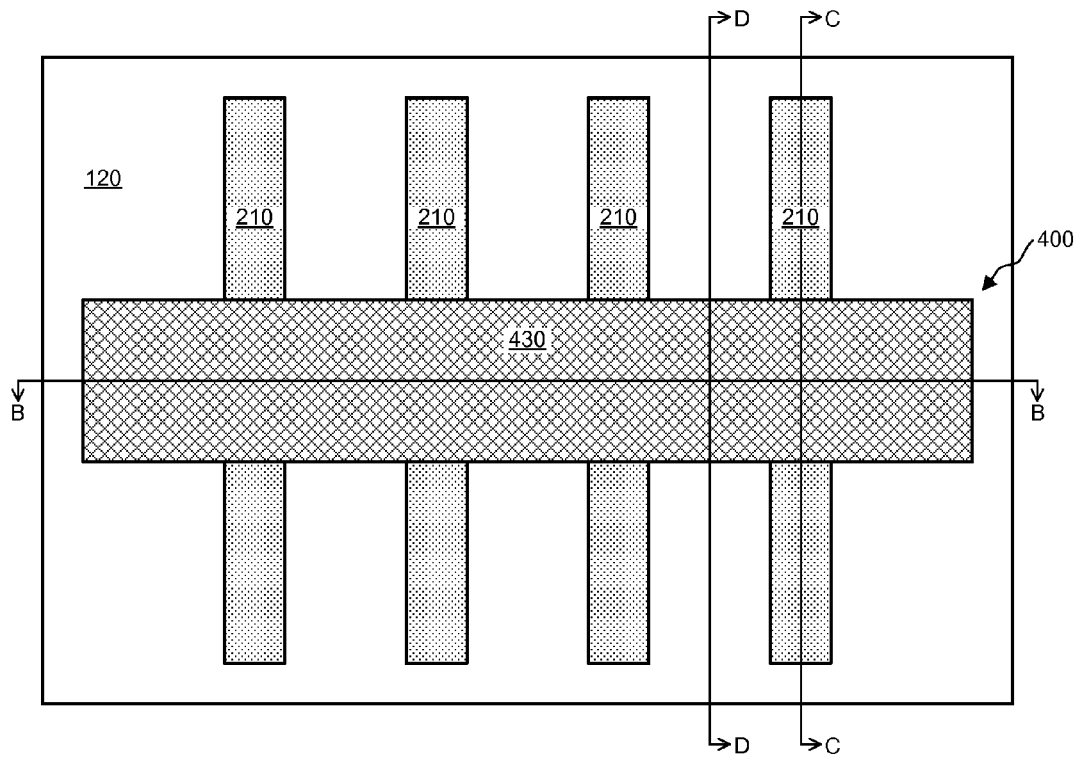
FIG. 5A is a top view depicting removing the dummy semiconductor regions from between the fins outside the sacrificial gate of FIGS. 4A-4D, according to embodiments of the present invention.
Figure 5B:
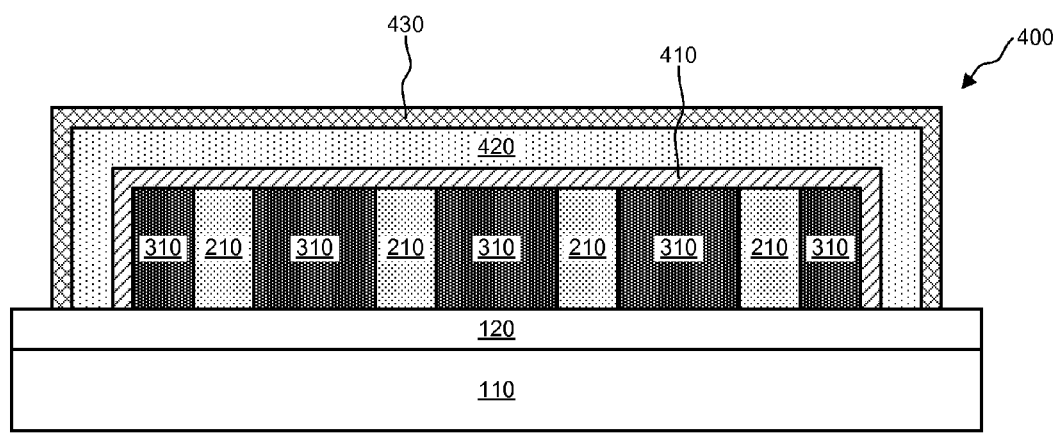
FIGS. 5B-5D are cross-sectional views of FIG. 5A, according to embodiments of the present invention.
Figure 5C:
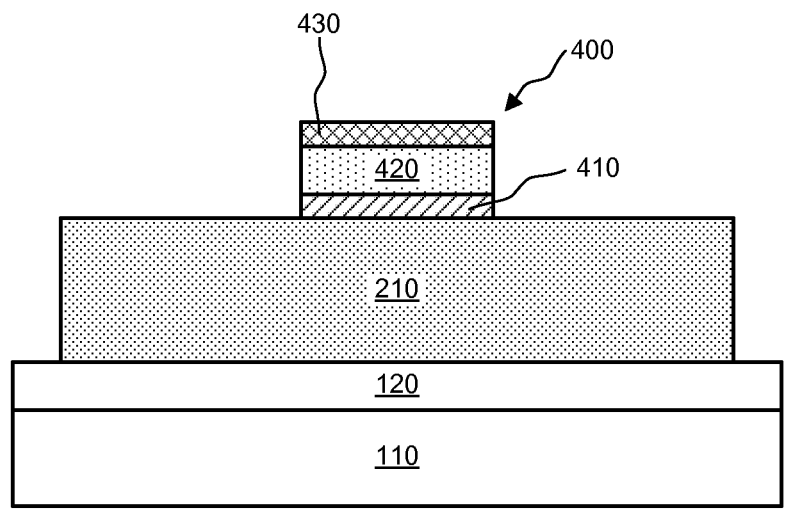
Figure 5D:
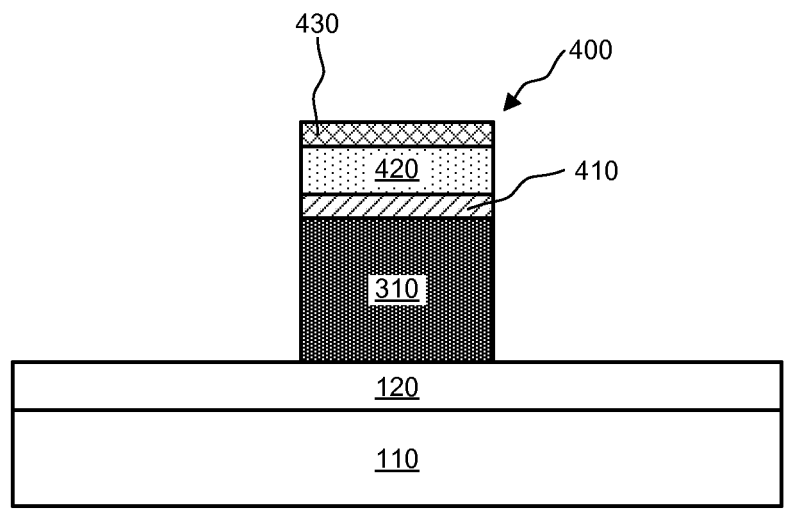

Referring to FIGS. 5A-5D, portions of the dummy semiconductor regions 310 not covered by the sacrificial gate 400 may be removed from between the fins 210. The portions of the dummy semiconductor regions 310 may be removed using any typical etching process capable of selectively removing the dummy semiconductor regions 310 without substantially etching elements of the surrounding structure, such as the fins 210 and the sacrificial gate 400. Exemplary etching processes may include anisotropic etching processes such as reactive ion etching (RIE) or plasma etching.

Figure 6A:
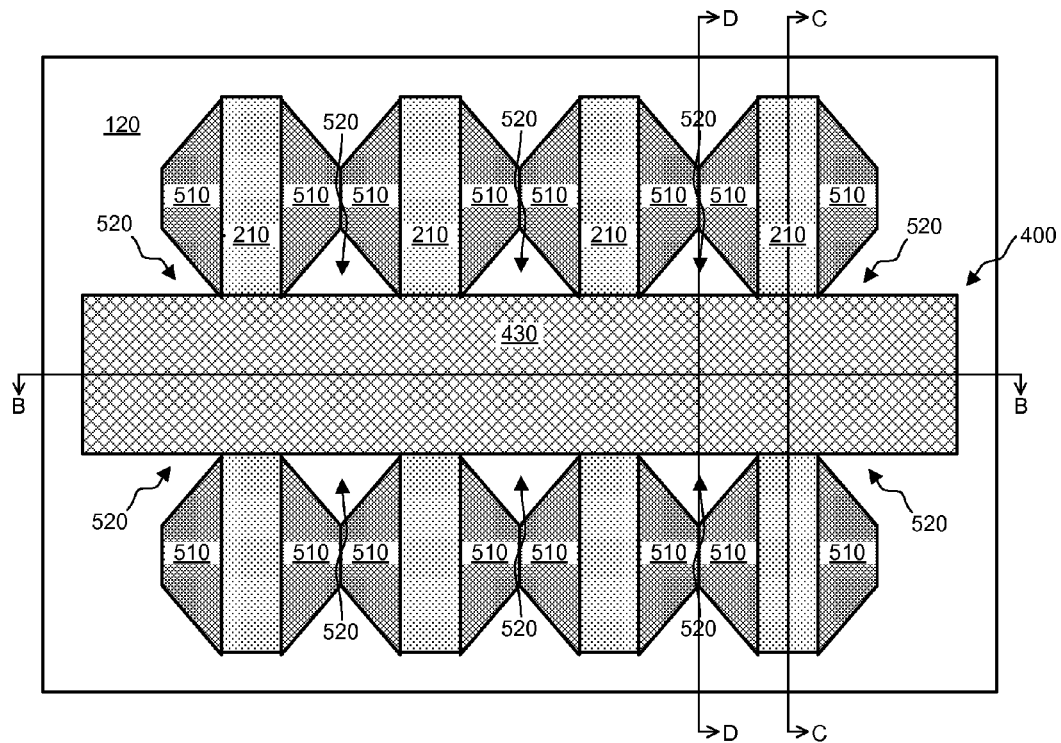
FIG. 6A is a top view depicting merging the fins of FIGS. 5A-5D outside of the sacrificial gate to form source/drain regions, according to embodiments of the present invention.
Figure 6B:
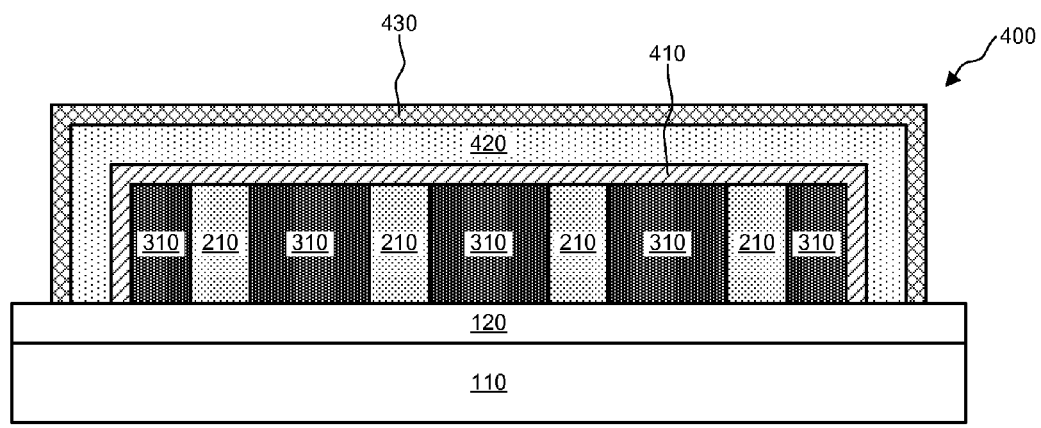
FIGS. 6B-6D are cross-sectional views of FIG. 6A, according to embodiments of the present invention.
Figure 6C:
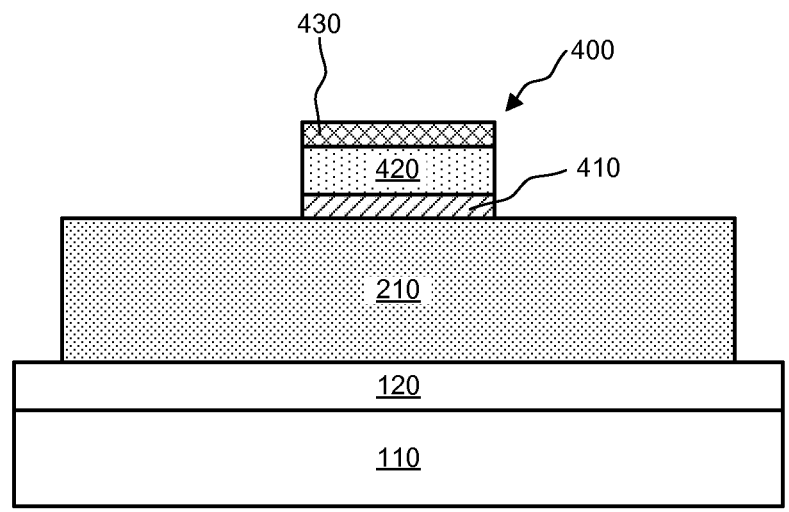
Figure 6D:
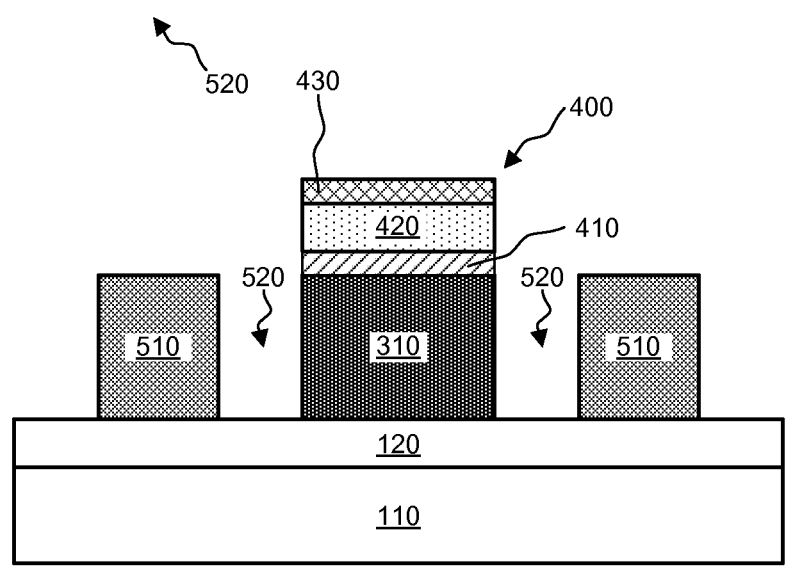

Referring to FIGS. 6A-6D, portions of the fins 210 not covered by the sacrificial gate 400 may be merged by forming faceted semiconductor regions 510 between the fins 210. Collectively, the faceted semiconductor regions 510 and the portions of the fins 210 not covered by the sacrificial gate 400 may serve as the source/drain regions of the finFET structure. The faceted semiconductor regions may intersect in such a way that gaps 520 form between the faceted semiconductor regions and the sacrificial gate 400. Because the gaps 520 prevent direct contact between the sacrificial gate 400 and the faceted semiconductor regions 510, a spacer may not be required between the faceted semiconductor regions 510 and the sacrificial gate 400. Elimination of a gate spacer may be particularly desirable in devices with complex 3D topography such as a multi-fin finFET, as it may be difficult to form the spacer only on the vertical sidewalls of the gate and not on other structures such as the vertical sidewalls of the fins.

The faceted semiconductor regions 510 may be formed by adjusting the process conditions of a selective epitaxy process. In this case, process conditions are such that the growth rate on (100) crystallographic orientation is significantly higher than the growth rate on (110) or (111) crystallographic orientations. Therefore, the growth rate on the sidewalls 211 (FIGS. 2A-2B) of the fins 210, which have a (100) surface, is significantly higher than the top surfaces 213 (FIGS. 2A-2B) of the fins 210 or the exposed surface of the dummy semiconductors 310 now located only underneath the dummy gate structure 400, which both have a (110) surface orientation (fins 210 crystal orientation labeled in FIGS. 2A-2B). The epitaxial growth is continued until it merges the fins, but it is effectively terminated when reaching a (111) surface, thus forming the facets. In one embodiment, to increase the difference between growth rate on (100) orientation versus (110) and (111), a chlorine containing gas such as HCl or $SiH_2Cl_2$ is added to the gases used for the epitaxy process.

In one embodiment, and preferably for pFETs, the faceted semiconductor regions 510 may be formed by epitaxial growth of silicon germanium (SiGe) with typical Ge concentration of approximately 30% to approximately 60%. In another embodiment, and preferably for nFETs, the faceted semiconductor regions 510 is formed by epitaxial growth of carbon-doped silicon (Si:C). In this case, Si:C is grown by flowing a Si containing gas such as $SiH_4$ and a carbon containing gas such as $CH_4$. In one embodiment, to form faceted structure a cyclic deposition and etch process is used. In the first step, a layer of Si:C is deposited by flowing silicon-containing and carbon-containing gases. In the next step, portions of the deposited layer are etched by flowing an etching gas, for example, HCl gas. These steps are repeated for a number of cycles until the desired thickness of the regions 510 is obtained. Process conditions such as the time for deposition and etch steps are adjusted to obtain (111) facets.

In some embodiments, the faceted semiconductor regions 510 may be in-situ doped during epitaxial growth by adding a dopant gas to the deposition gas (i.e., the Si-containing gas). Exemplary dopant gases may include a boron-containing gas such as BH$_3$ for pFETs or a phosphorus- or arsenic-containing gas such as PH$_3$ or AsH$_3$ for nFETs.

Figure 7A:
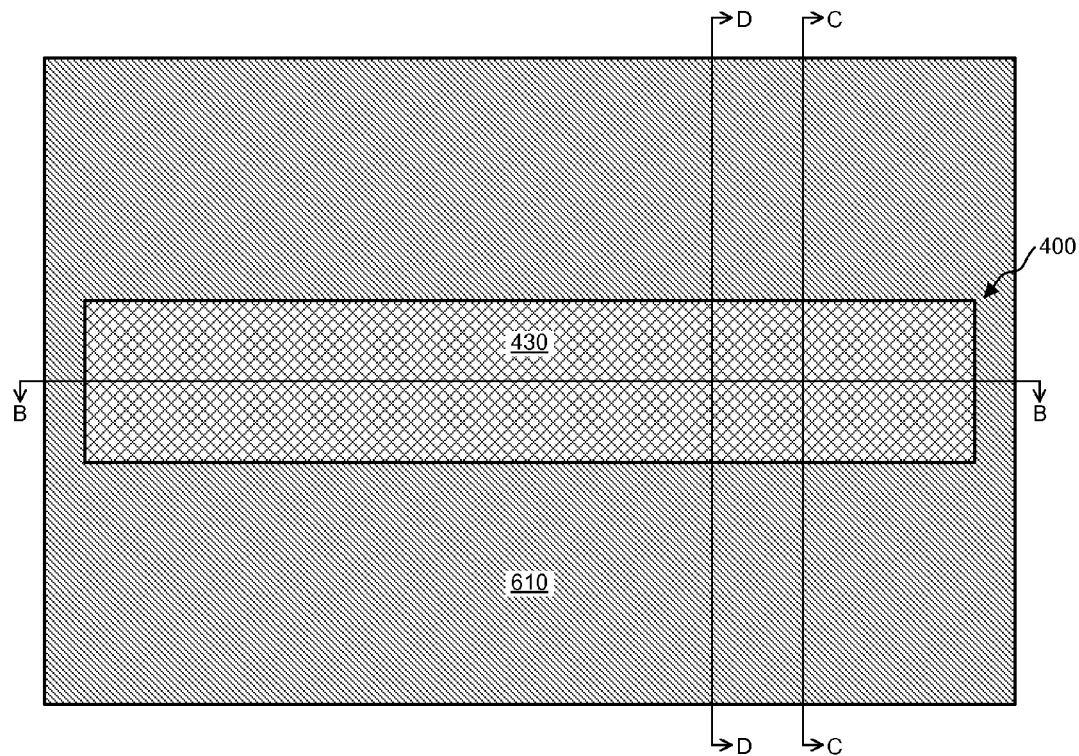
FIG. 7A is a top view depicting depositing a dielectric layer above the structure of FIGS. 6A-6D, according to embodiments of the present invention.
Figure 7B:
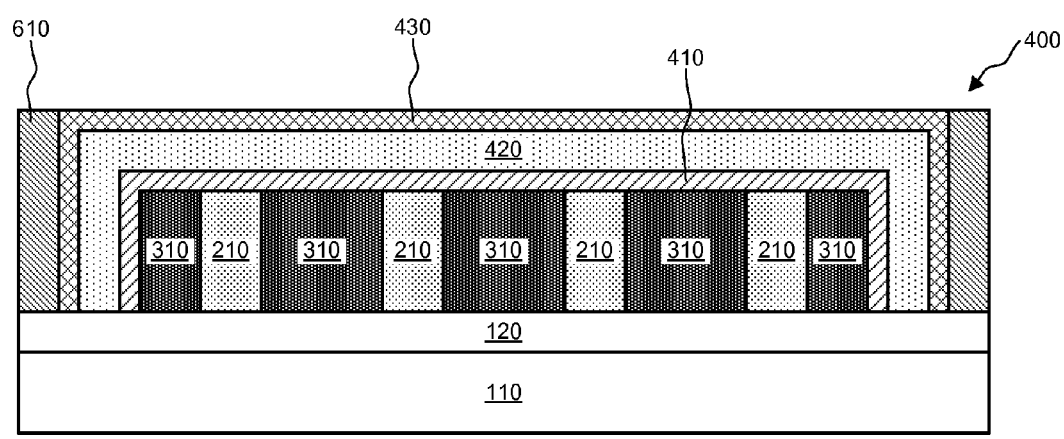
FIGS. 7B-7D are cross-sectional views of FIG. 7A, according to embodiments of the present invention.
Figure 7C:
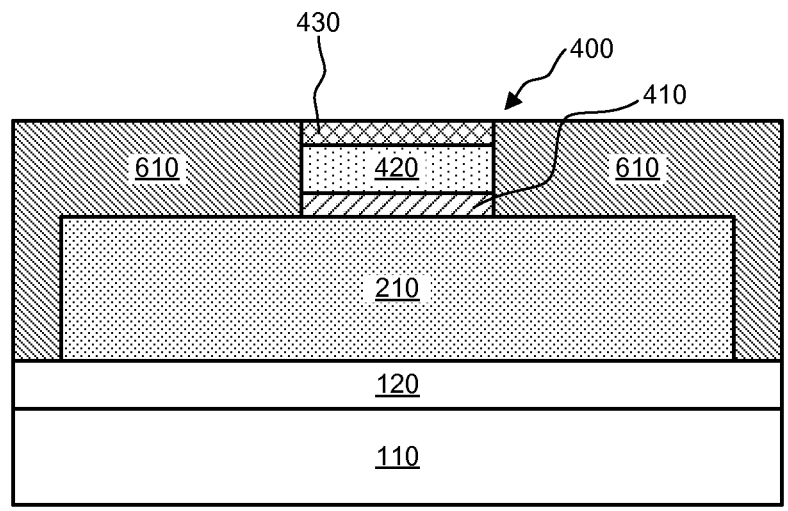
Figure 7D:
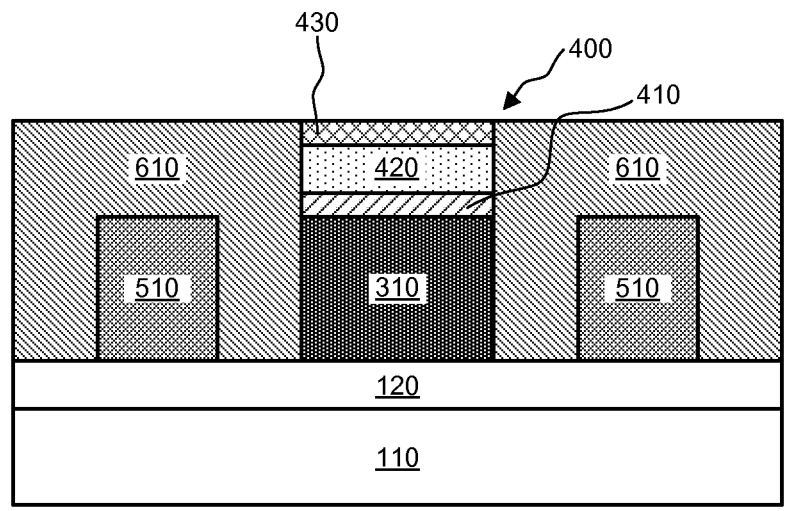

Referring to FIGS. 7A-7D, a dielectric layer 610 may be deposited above the structure of FIGS. 6A-6D. The dielectric layer 610 may include any suitable dielectric material, for example, silicon oxide, silicon nitride, hydrogenated silicon carbon oxide, silicon based low-k dielectrics, porous dielectrics, or organic dielectrics including porous organic dielectrics. The dielectric layer 610 may be formed using known suitable deposition techniques, such as, for example, atomic layer deposition (ALD), chemical vapor deposition (CVD), plasma enhanced chemical vapor deposition, spin on deposition, or physical vapor deposition (PVD). In some embodiments, various barriers or liners (not shown) may be formed below the dielectric layer 610. The gaps 520 between the faceted semiconductor regions 510 and the gate 400 may also be filled with the dielectric layer 610 at this step, so that the dielectric layer 610 isolates the faceted semiconductor regions 510 from the gate 400. After deposition, the dielectric layer 610 may be planarized using a typical planarization process such as chemical-mechanical planarization (CMP), so that the top surface of the sacrificial gate 400 is exposed.

Figure 8A:
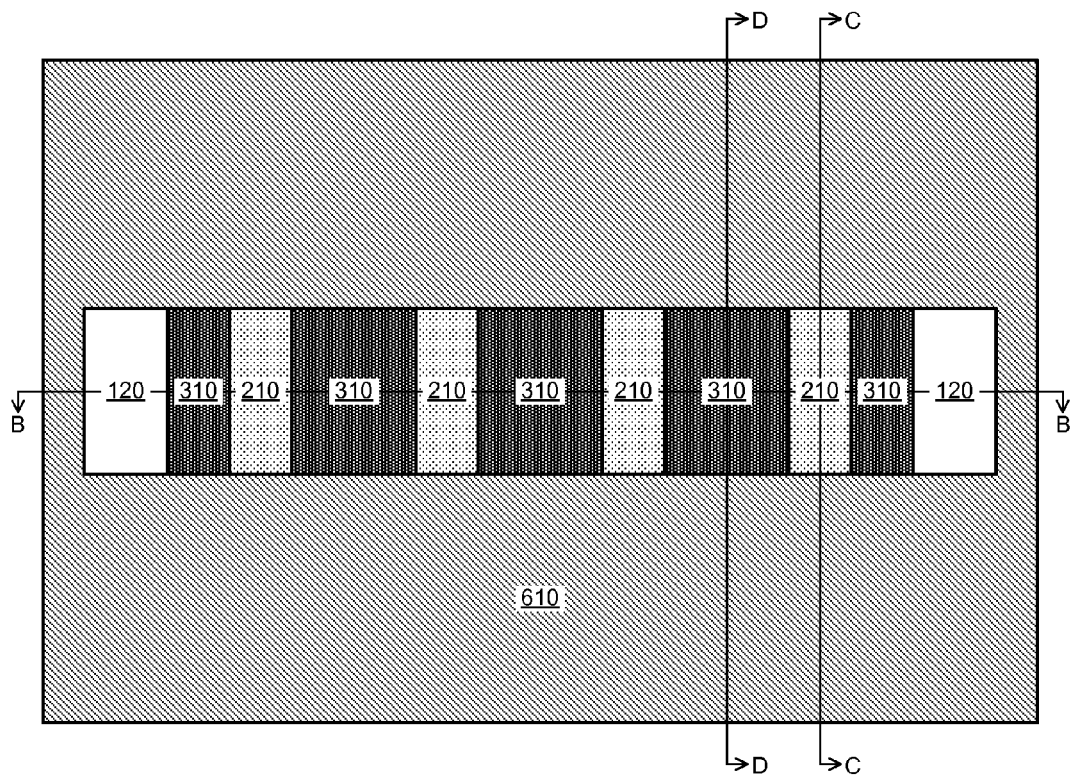
FIG. 8A is a top view depicting removing the sacrificial gate of FIG. 7A-D, according to embodiments of the present invention.
Figure 8B:
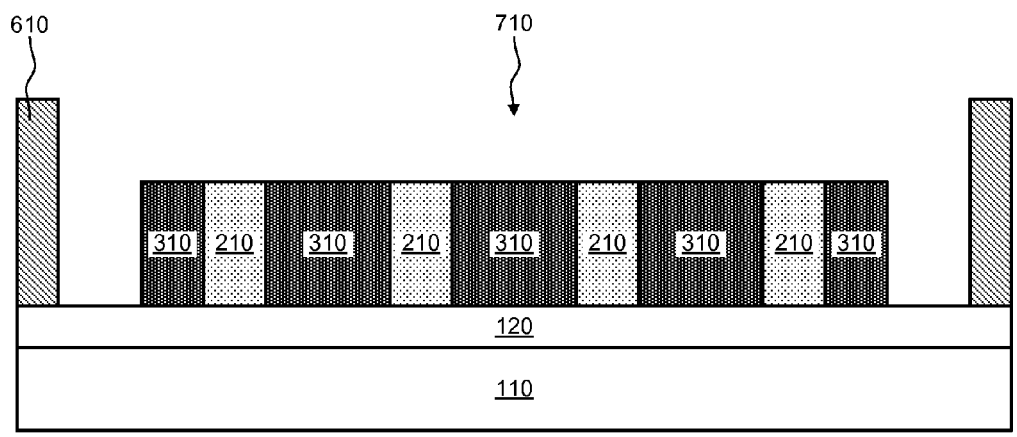
FIGS. 8B-8D are cross-sectional views of FIG. 8A, according to embodiments of the present invention.
Figure 8C:
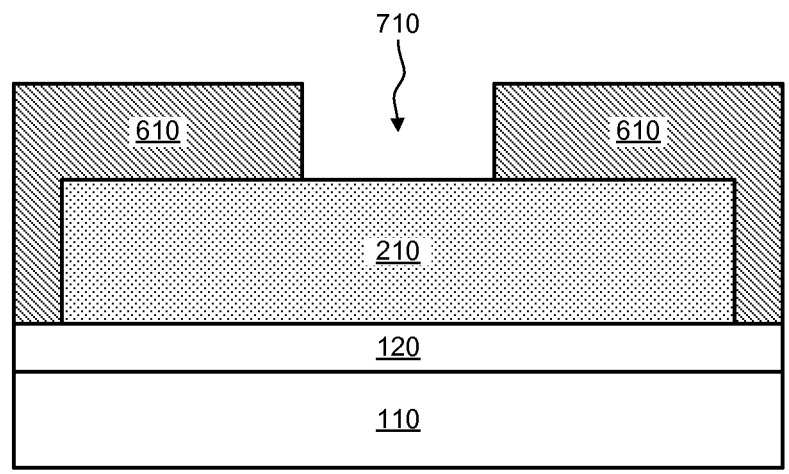
Figure 8D:
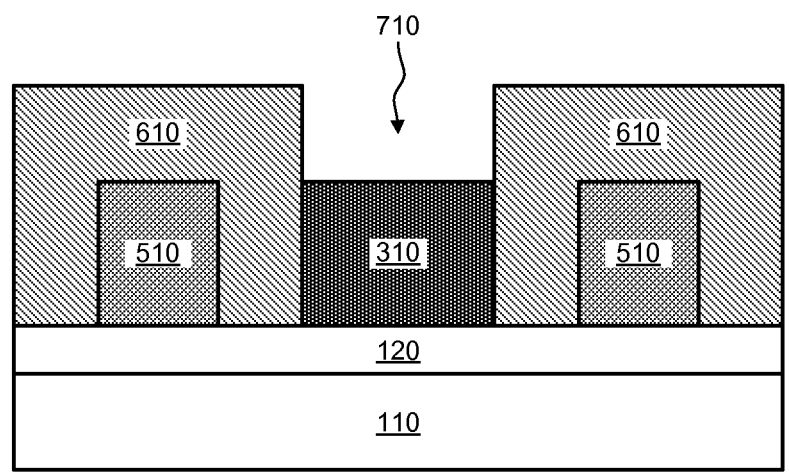

Referring to FIGS. 8A-8D, the sacrificial gate 400 may be removed to form a gate recess 710 above the fins 210 and the dummy semiconductor regions 310. The sacrificial gate 400 may be removed using any suitable etching process capable of selectively removing the components of the sacrificial gate 400, including, for example, the sacrificial dielectric layer 410, the sacrificial gate electrode 420, and the hard cap 430, without substantially etching the fins 210 and the dummy semiconductor regions 310. Exemplary etching processes may include RIE, plasma etching, or laser ablation. The etching process may involve multiple steps with different etch chemistries to separately remove components made of different materials.

Figure 9A:
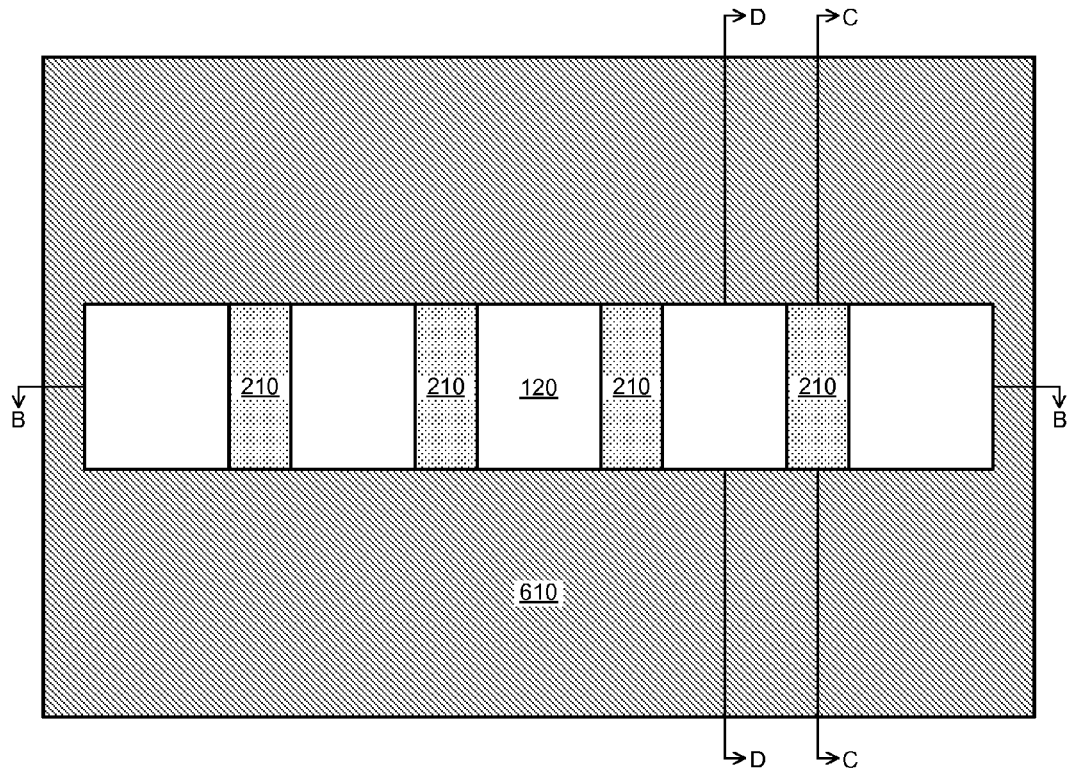
FIG. 9A is a top view depicting removing the dummy semiconductor regions from between the exposed fins of FIGS. 8A-8D, according to embodiments of the present invention.
Figure 9B:
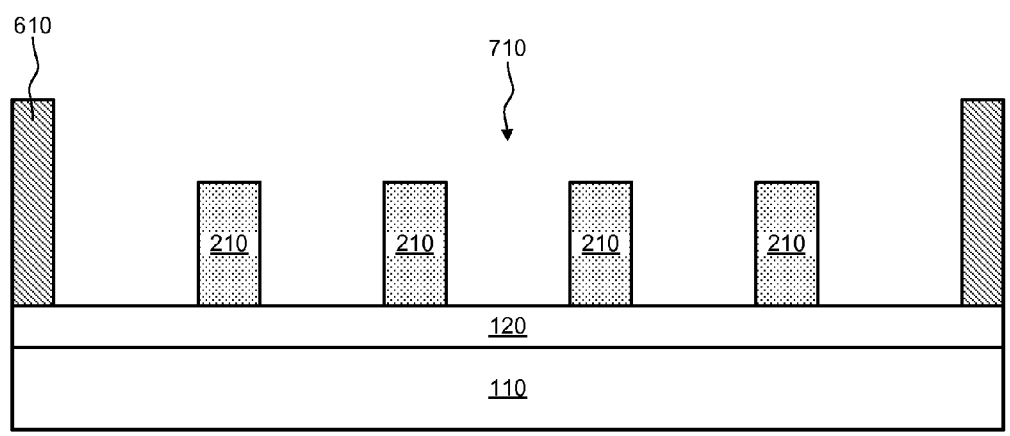
FIGS. 9B-9D are cross-sectional views of FIG. 9A, according to embodiments of the present invention.
Figure 9C:
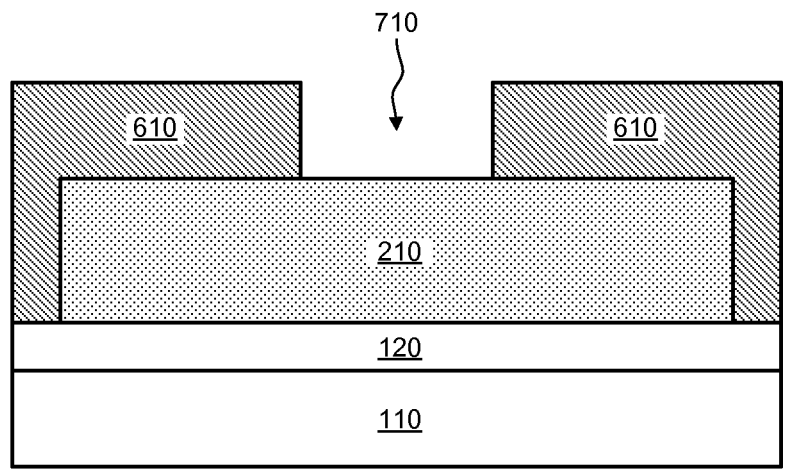
Figure 9D:
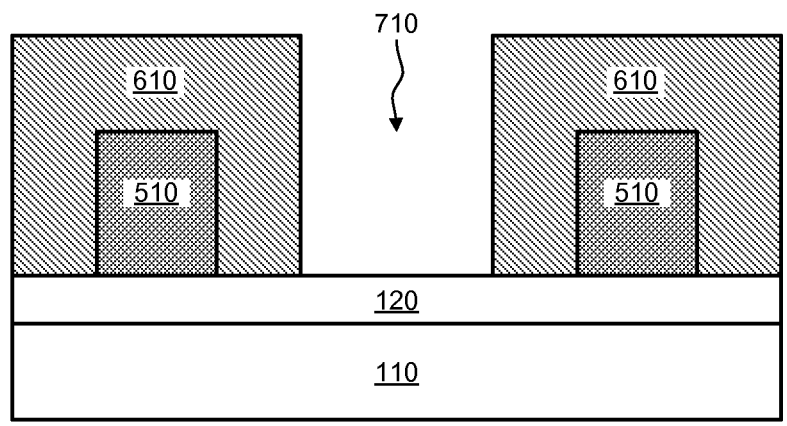

Referring to FIGS. 9A-9D, the dummy semiconductor regions 310 may be removed from between the fins 210 beneath the gate recess 710. The dummy semiconductor regions 310 may be removed using any typical etching process capable of selectively removing the dummy semiconductor regions 310 without substantially etching elements of the surrounding structure, such as the fins 210 and the dielectric layer 610. Exemplary etching processes may include anisotropic etching processes such as reactive ion etching (RIE) or plasma etching.

Figure 10A:
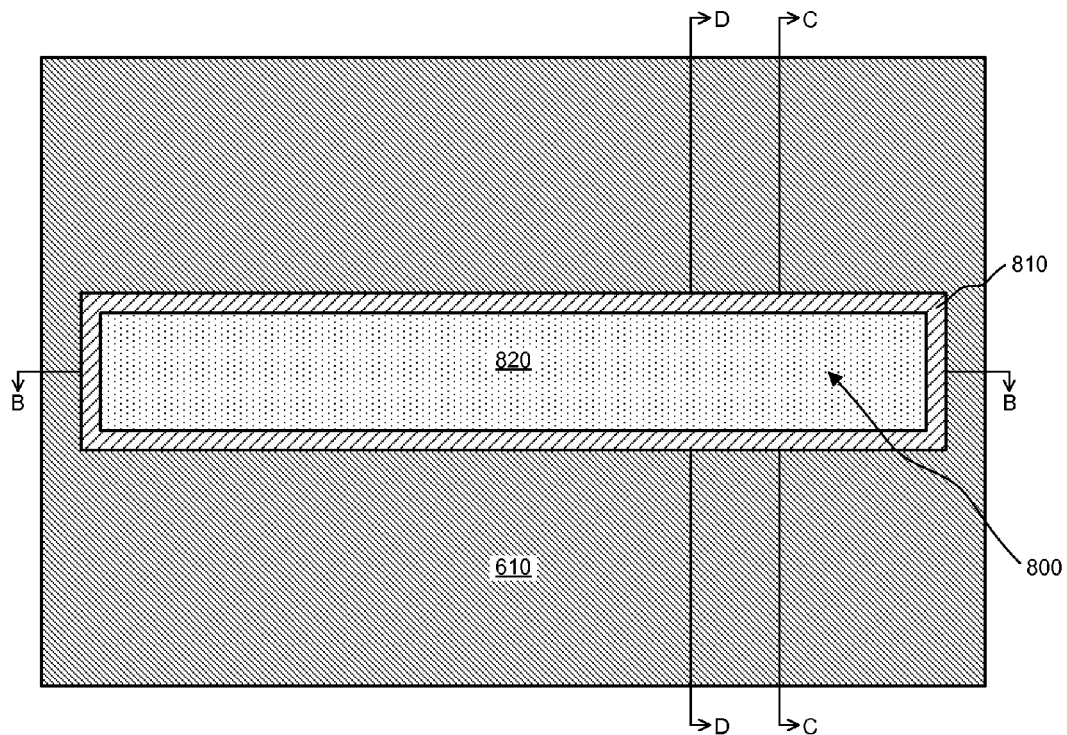
FIG. 10A is a top view depicting forming a metal gate above the exposed fins of FIGS. 9A-9D, according to embodiments of the present invention.
Figure 10B:
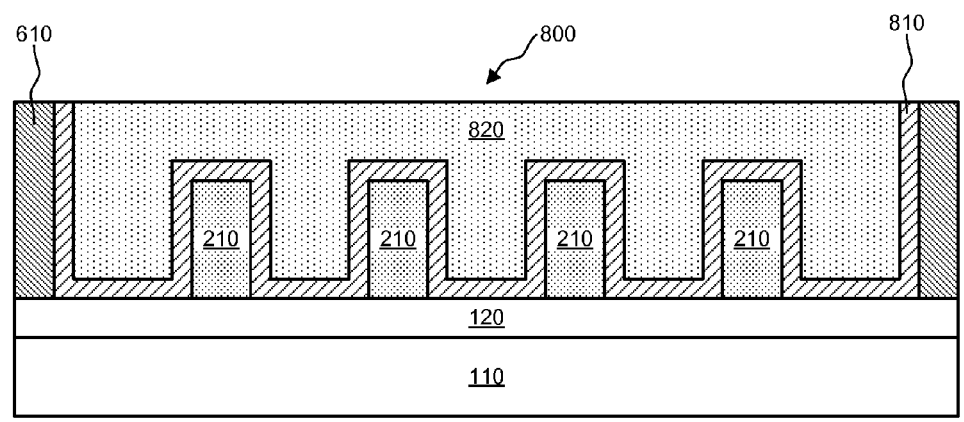
FIGS. 10B-10D are cross-sectional views of FIG. 10A, according to embodiments of the present invention.
Figure 10C:
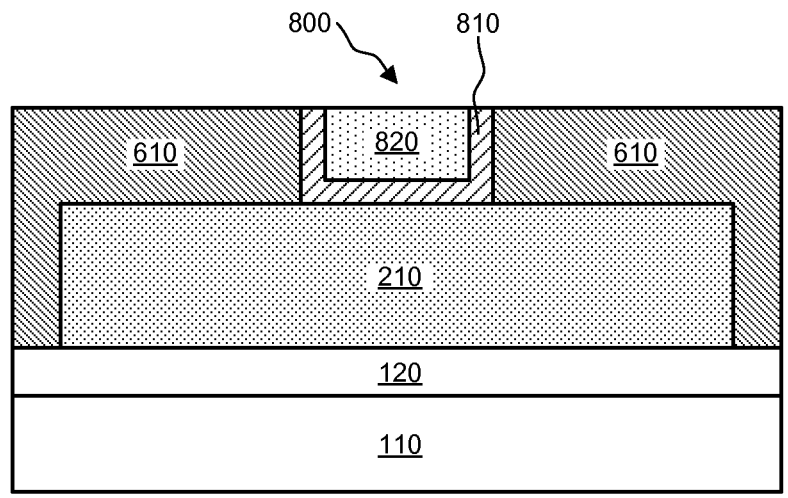
Figure 10D:
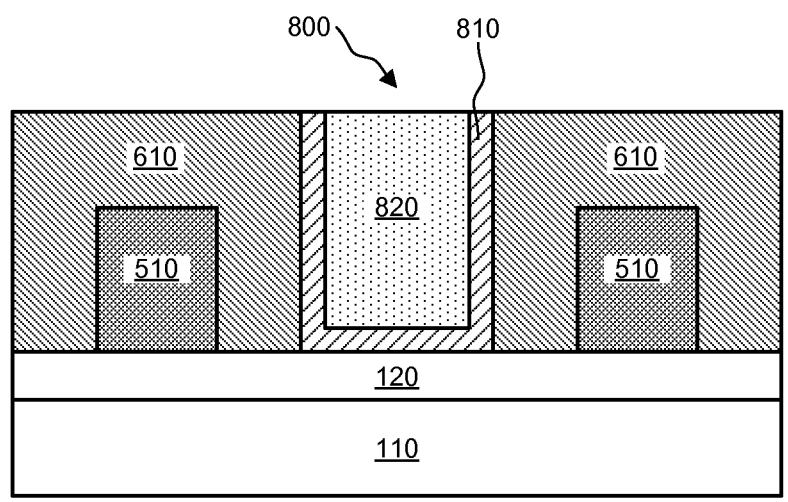

Referring to FIGS. 10A-10D, the gate recess 710 (FIGS. 9A-9D) may be filled by a replacement metal gate 800. The replacement metal gate 800 may include a gate dielectric layer 810 and a gate electrode layer 820. The gate dielectric layer 810 and the gate electrode layer 820 may be deposited by any suitable technique known in the art, for example by ALD, CVD, PVD, MBD, PLD, or LSMCD. The gate dielectric may include an insulating material including, but not limited to: oxide, nitride, oxynitride or silicate including metal silicates and nitrided metal silicates. In one embodiment, the gate dielectric layer 810 may include an oxide such as, for example, SiO$_2$, HfO$_2$, ZrO$_2$, Al$_2$O$_3$, TiO$_2$, La$_2$O$_3$, SrTiO$_3$, LaAlO$_3$, and mixtures thereof. The physical thickness of the gate dielectric layer 810 may vary, but typically may have a thickness ranging from approximately 0.5 nm to approximately 10 nm. The gate electrode may be formed on top of the gate dielectric. The gate electrode layer 820 may include, for example, Zr, W, Ta, Hf, Ti, Al, Ru, Pa, metal oxides, metal carbides, metal nitrides, transition metal aluminides (e.g. Ti$_3$Al, ZrAl), TaC, TiC, TaMgC, or any combination of those materials. The gate electrode may also include a silicon layer located on top of a metal material, whereby the top of the silicon layer may be silicided.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A semiconductor structure comprising:
semiconductor fins;
a gate over a center portion of the semiconductor fins; and
faceted semiconductor regions between the semiconductor fins outside of the gate,
wherein gaps exist between the faceted semiconductor regions and the gate so that the faceted semiconductor regions do not directly contact the gate,
wherein uppermost surfaces of the faceted semiconductor regions are in parallel with uppermost surfaces of the semiconductor fins.

2. The semiconductor structure of claim 1, further comprising:
a dielectric layer covering the semiconductor fins, wherein the dielectric layer fills the gaps between the faceted semiconductor regions and the gate.

3. The semiconductor structure of claim 2, wherein the dielectric layer is in direct contact with the faceted semiconductor regions and the gate.

4. The semiconductor structure of claim 1, wherein the faceted semiconductor regions comprise silicon-germanium or carbon-doped silicon.

5. The semiconductor structure of claim 1, wherein the semiconductor fins are on top of an insulator.

6. A semiconductor structure comprising:
first and second semiconductor fins on an insulator;
a gate over center portions of the first and second semiconductor fins; and
faceted semiconductor regions, one of which is in direct contact with a sidewall of an end portion of the first semiconductor fin and another one of which is in direct contact with a sidewall of an end portion of the second semiconductor fin, wherein the faceted semiconductor regions respectively extend from sidewalls of the end portions of the first and second semiconductor fins, and the faceted semiconductor regions do not contact the gate; and
faceted dielectric regions located between the end portions of the first and second semiconductor fins and in direct contact with the gate and the faceted semiconductor regions,
wherein uppermost surfaces of the faceted semiconductor regions are in parallel with uppermost surfaces of the first and second semiconductor fins.

7. The semiconductor structure of claim 6, wherein the faceted semiconductor regions are in direct contact with each other.

8. The semiconductor structure of claim 6, wherein the faceted semiconductor regions includes at least one same material as each of the first and second semiconductor fins.

9. The semiconductor structure of claim 6, wherein the faceted semiconductor regions comprise silicon germanium.

10. The semiconductor structure of claim 6, wherein the faceted semiconductor regions comprise silicon carbon.

11. The semiconductor structure of claim 6, further comprising:
- a gate dielectric layer in direct contact with a covering the center portions of the first and second semiconductor fins, the gate dielectric layer is located between the gate and each of the first and second semiconductor fins and separates the gate from the first and second semiconductor fins.

12. The semiconductor structure of claim 6, further comprising:
- a gate dielectric layer in direct contact with a covering the center portions of the first and second semiconductor fins.

13. A semiconductor structure comprising:
- first and second semiconductor fins over an insulator;
- a gate above and between center portions of the first and second semiconductor fins;
- merged source drain regions comprising a first end portion of the first semiconductor fin, a second end portion of the second semiconductor fin, and faceted semiconductor regions, wherein one of the faceted semiconductor regions is in direct contact with a sidewall of the first end portion, another one of the faceted semiconductor regions is in direct contact with a sidewall of the second end portion, the faceted semiconductor regions respectively extend between the sidewalls of first and second end portions, and the faceted semiconductor regions do not contact the gate; and
- faceted dielectric regions located between the first and second end portions and in direct contact with the gate and the faceted semiconductor regions,
- wherein uppermost surfaces of the faceted semiconductor regions are in parallel with uppermost surfaces of the first and second semiconductor fins.

14. The semiconductor structure of claim 13, wherein the faceted semiconductor regions includes at least one same material as each of the first and second semiconductor fins.

15. The semiconductor structure of claim 13, wherein the faceted semiconductor regions comprise silicon germanium.

16. The semiconductor structure of claim 13, wherein the faceted semiconductor regions comprise silicon carbon.

17. The semiconductor structure of claim 13, further comprising:
- a gate dielectric layer in direct contact with a covering the center portions of the first and second semiconductor fins, the gate dielectric layer is located between the gate and each of the first and second semiconductor fins and separates the gate from the first and second semiconductor fins.

18. The semiconductor structure of claim 13, further comprising:
- a gate dielectric layer in direct contact with a covering the center portions of the first and second semiconductor fins.

* * * * *